(12) United States Patent
Liu

(10) Patent No.: US 12,096,673 B2
(45) Date of Patent: Sep. 17, 2024

(54) DISPLAY PANEL AND METHOD FOR MANUFACTURING SAME

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Hongmei Liu, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/298,609

(22) PCT Filed: May 18, 2021

(86) PCT No.: PCT/CN2021/094392
§ 371 (c)(1),
(2) Date: May 31, 2021

(87) PCT Pub. No.: WO2022/227135
PCT Pub. Date: Nov. 3, 2022

(65) Prior Publication Data
US 2024/0016023 A1    Jan. 11, 2024

(30) Foreign Application Priority Data

Apr. 28, 2021    (CN) .......................... 202110469705.8

(51) Int. Cl.
*H10K 59/38*    (2023.01)
*H10K 59/12*    (2023.01)
(Continued)

(52) U.S. Cl.
CPC ......... *H10K 59/38* (2023.02); *H10K 59/1201* (2023.02); *H10K 59/8792* (2023.02); *H10K 59/122* (2023.02)

(58) Field of Classification Search
CPC .... H10K 59/30; H10K 59/38; H10K 59/1201; H10K 59/8792; H10K 59/122;
(Continued)

(56) References Cited

U.S. PATENT DOCUMENTS

| 9,577,014 B2* | 2/2017 | Ishii ....................... H10K 59/38 |
| 2015/0084026 A1* | 3/2015 | Miyamoto ........... H10K 50/858 |
| | | 257/40 |

(Continued)

FOREIGN PATENT DOCUMENTS

| CN | 105867039 | 8/2016 |
| CN | 108493211 | 9/2018 |

(Continued)

*Primary Examiner* — Natalia A Gondarenko

(57) ABSTRACT

A display panel and a method for manufacturing same are provided. The display panel includes a light emitting device layer and a light filter layer. The light filter layer is arranged on a light-emitting side of the light emitting device layer. The light filter layer includes color resists and a light-shielding layer adjacently arranged. Each color resist has an extension portion, and the extension portion of the color resist is stacked and arranged in a pixel spacer portion of the display panel to form the light-shielding layer. Therefore, a laminated structure which can effectively prevent color shifts of light emitted from inside of the display panel is provided, thereby improving display effect of the display panel.

14 Claims, 5 Drawing Sheets

(51) Int. Cl.
*H10K 59/122* (2023.01)
*H10K 59/80* (2023.01)

(58) Field of Classification Search
CPC .......... H10K 50/865; H10K 2201/331; H10K 59/12; H10K 59/126; H10K 59/127; H10K 59/1275; G02F 1/136209; G02F 1/13394; G02F 1/136286; G02F 1/1368; G02F 1/133345; G02F 2201/121; G02F 2201/123; G02F 2001/13396; G02F 2001/136222; H01L 31/12; H01L 31/125; H01L 31/143; H01L 31/153; H01L 31/162; H01L 31/173
USPC .............................................. 257/89, 40, 72
See application file for complete search history.

(56) References Cited

U.S. PATENT DOCUMENTS

2015/0318447 A1    11/2015  Choi
2022/0158113 A1*    5/2022  Kim .................... H10K 50/131

FOREIGN PATENT DOCUMENTS

| CN | 110010653 | 7/2019 | | |
|---|---|---|---|---|
| CN | 110034167 | 7/2019 | | |
| CN | 110098230 | 8/2019 | | |
| CN | 110707132 | 1/2020 | | |
| CN | 111029388 | 4/2020 | | |
| KR | 2022068307 A | * | 5/2022 | ......... H01L 51/5044 |
| WO | WO-2019218342 A1 | * | 11/2019 | ............. H01L 25/50 |

* cited by examiner

DISPLAY PANEL AND METHOD FOR MANUFACTURING SAME

FIELD OF INVENTION

The present disclosure relates to the technical field of display panel manufacturing, and particularly to a display panel and a method for manufacturing same.

BACKGROUND

With continuous improvements of display technology, people have higher requirements for performance and quality of display panels and display devices.

Organic light-emitting diode (OLED) devices have advantages of light weight, wide viewing angles, fast response times, low temperature resistance, and high luminous efficiencies. Generally, an OLED display panel includes a plurality of units of light-emitting device, and each display device is composed of an anode, a cathode, and a light emitting layer disposed between the two. However, when external light is incident on the OLED display panel, since the anode and cathode are mostly made of metal or materials with reflective characteristics, the external light will be reflected back, thereby reducing display effects. In order to solve above problems, a circular polarizer is usually arranged on a light emitting side of the OLED. However, after disposing the circular polarizer, half of the external light cannot first pass through when the external light passes through the polarizing film, and remaining half of the external light have a 90 degrees difference with the original polarization direction after passing through the λ/4 phase retardation film and then is reflected by the anode/cathode so that the reflected light cannot pass through the polarizing film layer to emit outward, thereby causing certain color shifts of the emitted light, which ultimately affects display effect of the display panel.

Therefore, it is necessary to propose solutions to problems in prior art.

SUMMARY OF DISCLOSURE

As disused above, in the existing organic light-emitting diode (OLED) devices, light emitted by the display device has certain color shifts when it is displayed on the screen so that display effects of the display panel is not ideal.

In order to solve above-mentioned problems, embodiments of the present application provide a display panel and a manufacturing method of the display panel, so as to effectively improve the problem that the display effect of the display panel is not ideal when displaying images in existing OLED devices.

In order to solve the above technical problems, the technical methods provided by the embodiments of the present application are as follows:

An object of the present application provides a display panel, comprising:
  a light emitting device layer; and
  a light filter layer, wherein the light filter layer comprises
    a plurality of color resists arranged on a light-emitting side of the light emitting device layer and a light shielding layer located between adjacent color resists;
  wherein each color resist has an extension portion, and the extension portion of the color resist is stacked on a pixel spacer region of the display panel to form the light shielding layer, and black light-absorbing particles are arranged in the extension portion.

According to one embodiment of the present application, the extension portion comprises a first color control layer, a second color control layer, and a third color control layer, and the first color control layer is disposed on the light emitting device layer, the second color control layer is disposed on the first color control layer, and the third color control layer is disposed on the second color control layer.

According to one embodiment of the present application, the first color control layer, the second color control layer, and the third color control layer are red color resist, green color resist and blue color resists arranged in any order.

According to one embodiment of the present application, thicknesses of the first color control layer, the second color control layer, and the third color control layer are less than thicknesses of the plurality of color resists.

According to one embodiment of the present application, the first color control layer, the second color control layer, and the third color control layer have the same thickness.

According to one embodiment of the present application, a thickness of the light shielding layer is the same as thicknesses of the plurality of color resists.

According to one embodiment of the present application, the display panel further comprises an encapsulation layer disposed between the light emitting device layer and the light filter layer.

Another object of the present application provides a display panel, comprising:
  a light emitting device layer; and
  a light filter layer, wherein the light filter layer comprises
    a plurality of color resists arranged on a light-emitting side of the light emitting device layer and a light shielding layer located between adjacent color resists;
  wherein each color resist has an extension portion, and the extension portion of the color resist is stacked on a pixel spacer region of the display panel to form the light shielding layer.

According to one embodiment of the present application, the extension portion comprises a first color control layer, a second color control layer, and a third color control layer, and the first color control layer is disposed on the light emitting device layer, the second color control layer is disposed on the first color control layer, and the third color control layer is disposed on the second color control layer.

According to one embodiment of the present application, the first color control layer, the second color control layer, and the third color control layer are red color resist, green color resist, and blue color resists arranged in any order.

According to one embodiment of the present application, thicknesses of the first color control layer, the second color control layer, and the third color control layer are less than a thickness of the color resist.

According to one embodiment of the present application, the first color control layer, the second color control layer, and the third color control layer have the same thickness.

According to one embodiment of the present application, the display panel further comprises an encapsulation layer disposed between the light emitting device layer and the light filter layer.

According to one embodiment of the present application, a convex or concave structure is provided between two adjacent color control layers.

According to one embodiment of the present application, the first color control layer, the second color control layer, and the third color control layer have the same length.

Yet another object of the present application provides a method for manufacturing a display panel, comprising following steps:

providing a substrate and forming a light emitting device layer on the substrate, wherein the light emitting device layer comprises a light-emitting sub-pixel region and a pixel spacer region adjacent to the light-emitting sub-pixel region;

forming a light filter layer on a light-emitting side of the light-emitting device layer, wherein the light filter layer comprises a plurality of color resists of different colors and a light shielding layer arranged between the plurality of color resists, wherein an extended portion of the color resist forms the light-shielding layer in a laminated structure in the pixel spacer region when forming the plurality of color resists of different colors by a mask process; and forming a cover plate on the light filter layer and encapsulating the display panel.

According to one embodiment of the present application, the extension portion comprises a first color control layer, a second color control layer, and a third color control layer stacked in sequence, and the first color control layer, the second color control layer and the third color control layer and the corresponding color resists are formed in the same mask process.

According to one embodiment of the present application, the mask corresponding to the pixel spacer is a half-open mask when the color resists of different colors are formed.

According to one embodiment of the present application, positions of the half-opening of the mask corresponding to the red color resist, the green color resist, and the blue color resist are different when forming the color resists.

According to one embodiment of the present application, the light filter layer is formed by an inkjet printing process.

In summary, beneficial effects of the embodiments of the present application are:

Embodiments of the present application provides a display panel and a method for manufacturing the same. In order to effectively improve display effects of the display panel, in the embodiment of the present application, a light filter layer is directly disposed on a light emitting device layer, and the light filter layer is formed into a single-layer light filter layer and a laminated structure light filter layer when forming the light filter layer. The laminated structure light filter layer can effectively eliminate color shifts of a emitted light, thereby improving the display quality and display effect of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Description of the following embodiments refers to specific embodiments that the present disclosure can be implemented in company with illustration of attached drawings.

With continuous developments of display panel manufacturing technology, it is hoped that the display panel and display device fabricated and obtained have better light-emitting performances and display effects. Embodiments of the present application provide a display panel and a manufacturing method of the display panel to effectively alleviate color shift problems of a display of existing organic light emitting diode (OLED) devices and improves display effect of the display panel.

Figure 1:
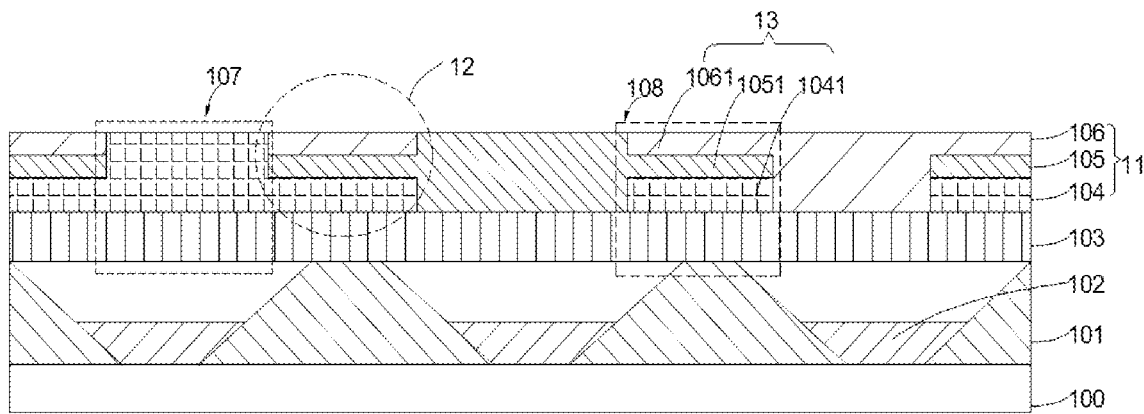
FIG. 1 is a schematic diagram of a film structure of a display panel provided by an embodiment of the present application.

As shown in FIG. 1, FIG. 1 is a schematic diagram of a film structure of a display panel provided by an embodiment of the application. The display panel comprises a base substrate 100, a pixel definition layer 101, and a light emitting layer 102. In this embodiment of the present application, the pixel definition layer 101 is disposed on the base substrate 100, and the pixel definition layer 101 is patterned and disposed on the base substrate 100 and has an opening area on the base substrate 100. Specifically, the pixel definition layer 101 forms a light-emitting sub-pixel region 107 and a pixel spacer region 108 on the base substrate 100, and the light-emitting sub-pixel region 107 and the pixel spacer region 108 are alternately disposed.

The light emitting layer 102 is disposed on the base substrate 100, and the light emitting layer 102 is disposed at a place corresponding to the light-emitting sub-pixel region 107 which corresponds to the pixel definition layer 101 at the same time.

The base substrate 100 in this embodiment of the present application may be a thin film transistor array substrate, and the light emitting layer 102 is connected to a source or drain of the thin film transistor through an anode layer, and forms a light emitting device layer. Furthermore, the thin film transistor array substrate realizes control of the light emitting layer 102 and drives the light emitting layer 102 to emit light, and finally realizes light-emitting display functions of the display panel.

The display panel of this embodiment of the present application further comprises an encapsulation layer 103. The encapsulation layer 103 is disposed on the pixel definition layer 101, and the encapsulation layer 103 covers the pixel definition layer 101 and the light emitting layer 102. The encapsulation layer 103 effectively prevents impurities such as external moisture and oxygen from entering the light emitting layer 102 from affecting light-emitting and display effects of the display panel.

Specifically, when the encapsulation layer 103 is provided, the encapsulation layer 103 can be dispose as a structure in which multiple inorganic and organic film layers are interleaved. Preferably, the encapsulation layer 103 may comprise a first inorganic layer, a first organic layer, and a second inorganic layer. Among them, the first inorganic layer can be directly arranged on the pixel definition layer, the first organic layer is arranged on the first inorganic layer, and the second inorganic layer is arranged on the first organic layer, thereby increasing the number of film layers of the encapsulation film layer 103 to further improve packaging effect of the display panel.

The encapsulation film layer 103 may be a transparent film layer, and a refractive index of light of the encapsulation film layer 103 can be selected according to actual needs, which will not be described in detail here.

Further, the display panel in the embodiment of the present application further comprises a light filter layer 11. The light filter layer 11 is disposed on the encapsulation layer 103, and filter effects of the light filter layer 11 is used to improve display effects of the display panel.

Specifically, the light filter layer 11 in the embodiment of the present application comprises color resists arranged on a light-emitting side of the light emitting device layer and a light shielding layer located between adjacent color resists. In this embodiment, a red color resist 104, a green color resist 105, and a blue color resist 106 are taken as examples for description. The color resists in the present application have an extension portion 13, and color resists of different colors correspond to an extension portion. The extension portion 13 is stacked in the pixel spacer region 108 and forms the above-mentioned light-shielding layer structure. In addition, the light filter layer 11 may also comprise color resists of other color layers, all of which are for improving display effects of the display panel.

When the light filter layer 11 is provided, the light filter layer 11 comprises a red color resist 104, a green color resist 105, and a blue color resist 106. Among them, the red color resist 104, the green color resist 105, and the blue color resist 106 are correspondingly disposed in the adjacent light-emitting sub-pixel regions 107. In this way, the red color resist 104, the green color resist 105, and the blue color resist 106 respectively form a single-layer light filter layer in the light-emitting sub-pixel region 107. When light passes through this region, for example, when the red sub-pixel passes through the red color resist 104, it only passes through the single-layer structure of the filter film layer.

Further, the light filter layer 11 in this embodiment of the present application further comprises a laminated structure 12, and the laminated structure 12 forms a light-shielding layer in the present application. The laminated structure 12 is correspondingly formed in the pixel spacer region 108 of the display panel. Since the pixel spacer region 108 corresponds to the non-opening region of the pixel definition layer 101, there is no light or less light can pass through this region. The light can be blocked by the light-shielding structure and when the light passing through, thereby improving display effects of the display panel.

The extension portion 13 in this embodiment of the present application may be configured as a multilayer film interleaved structure. The extension portion 13 in this embodiment is described by taking the first color control layer 1041, the second color control layer 1051, and the third color control layer 1061 as examples.

That is, the filter composite layer comprises a first color control layer 1041, a second color control layer 1051, and a third color control layer 1061. Among them, the first color control layer 1041 is disposed on the encapsulation layer 103, the second color control layer 1051 is disposed on the first color control layer 1041, and the third color control layer 1061 is disposed on the second color control layer 1051. As a result, a layered structure is formed in the pixel spacer region 108.

Because the light filter layer 11 in this embodiment of the present application is directly disposed on the encapsulation layer 103. Therefore, in order to simplify the fabrication process and save the number of photomasks and masks when the laminated structure is disposed. The first color control layer 1041, the second color control layer 1051, and the third color control layer 1061 in this embodiment of the present application may correspond to the same film layer as the red color resist, the green color resist, and the blue color resist. Among them, the red color resist, the green color resist, and the blue color resist are arranged adjacent to each other in the corresponding light-emitting sub-pixel region 107.

At this time, the first color control layer 1041, the second color control layer 1051, and the third color control layer 1061 are the extension portions of the corresponding monochromatic color resists. However, a thickness of each color control layer is smaller than a thickness of the color resist layer in the light-emitting sub-pixel region 107.

The first color control layer 1041, the second color control layer 1051, and the third color control layer 1061 in this embodiment of the present invention can be a red color resist, a green color resist, and a blue color resist arranged in any order. The specific colors are not performed limited here, and it can be a color that just play the role of color filtering.

Preferably, the first color control layer 1041, the second color control layer 1051, and the third color control layer 1061 in this embodiment can also be disposed to different thicknesses. At the same time, a total thickness of the light shielding layer may be the same as a thickness of the adjacent monochromatic color resist. Specifically, the thickness of each color control layer can be disposed according to actual needs of the product.

Further, in order to improve shielding effects of the first color control layer 1041, a certain amount of black light-absorbing particles is added to the first color control layer 1041, the second color control layer 1051, and the third color control layer 1061 when forming the first color control layer 1041, the second color control layer 1051, and the third color control layer 1061 in this embodiment of the present application by evaporation deposition to deposit the black light-absorbing particles into each sub-color control layer, thereby effectively improving light absorption or light blocking effects of the laminated structure.

At the same time, when disposing each sub-color control layer, a convex or concave structure and other micro-irregular structures can also be provided between two adjacent sub-color control layers. The irregular structure can effectively improve light-blocking performances of the pixel spacer region 108. When light passes through the above-mentioned irregular structured layer, it will be acted on by the structured layer many times, and finally the light cannot affect the pixel spacer region 108 so that the light can leak out from the light-emitting sub-pixel region 107 as much as possible, thereby improving display effects of the display panel.

Preferably, in order to ensure the consistency of the light-shielding layer and simplify the fabrication process, when the first color control layer 1041, the second color control layer 1051, and the third color control layer 1061 are provided, a length of each sub-color control layer can be disposed to be the same length, thereby simplifying the fabrication process and improving production efficiency of the display panel.

Figure 2:
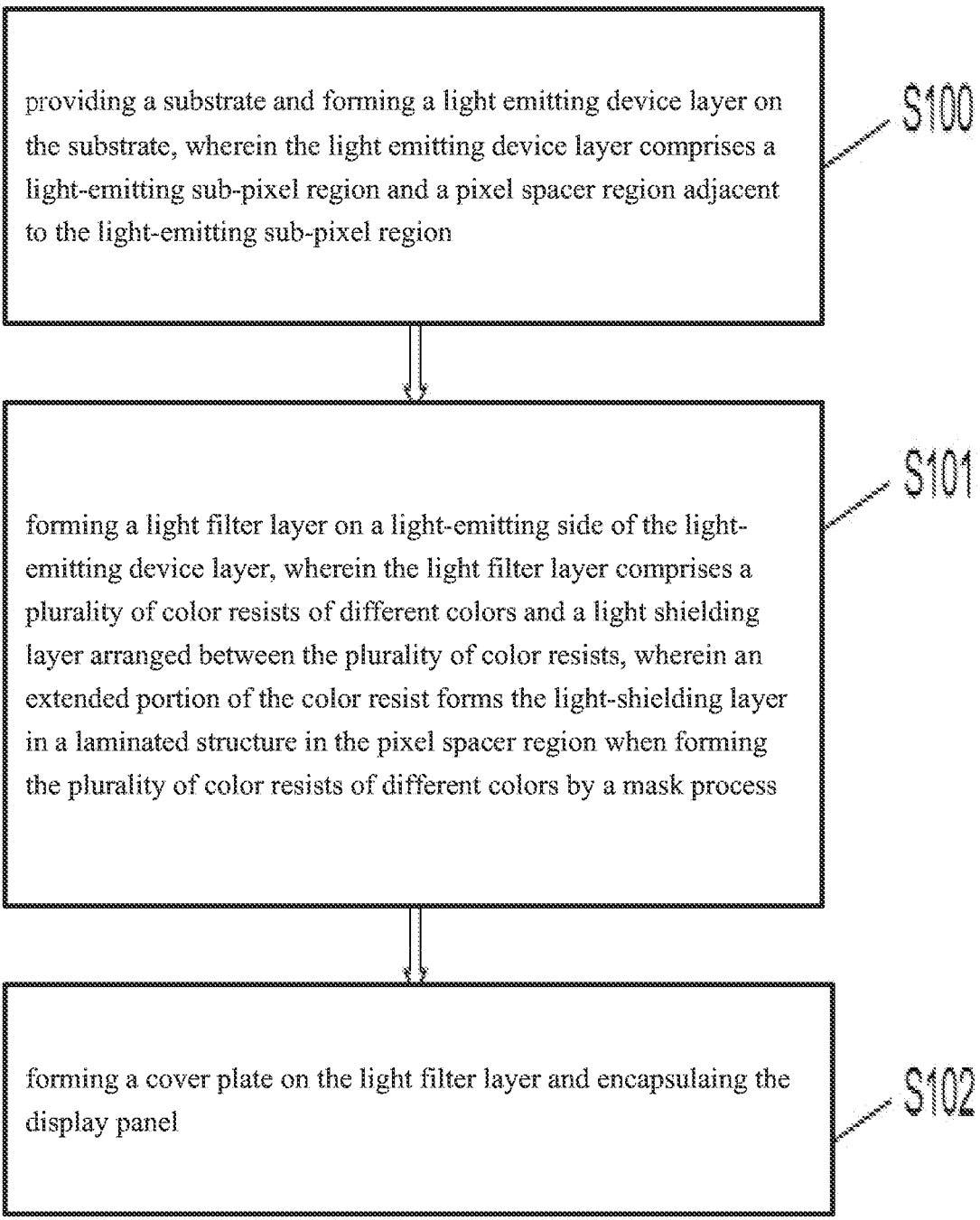
FIG. 2 is a schematic flowchart of a process for manufacturing a display panel provided by an embodiment of the present application.

Further, this embodiment of the present application also provides a method for manufacturing a display panel. As shown in FIG. 2, FIG. 2 is a schematic diagram of a process flow of a method for manufacturing a display panel provided by an embodiment of the application, comprising following steps:

S100: providing a substrate, and forming a light-emitting device layer on the substrate, the light-emitting device layer comprises a light-emitting sub-pixel region and a pixel spacer region adjacent to the light-emitting sub-pixel region;

S101: forming a light filter layer on a light-emitting side of the light-emitting device layer, wherein the light filter layer comprises color resists of different colors and a light-shielding layer arranged between the color resists. When forming color resists of different colors by a mask process, an extension of the color resists forms the light-shielding layer of a laminated structure in the pixel spacer region; and S102: forming a cover plate on the light filter layer, and encapsulating the display panel.

Figure 3:
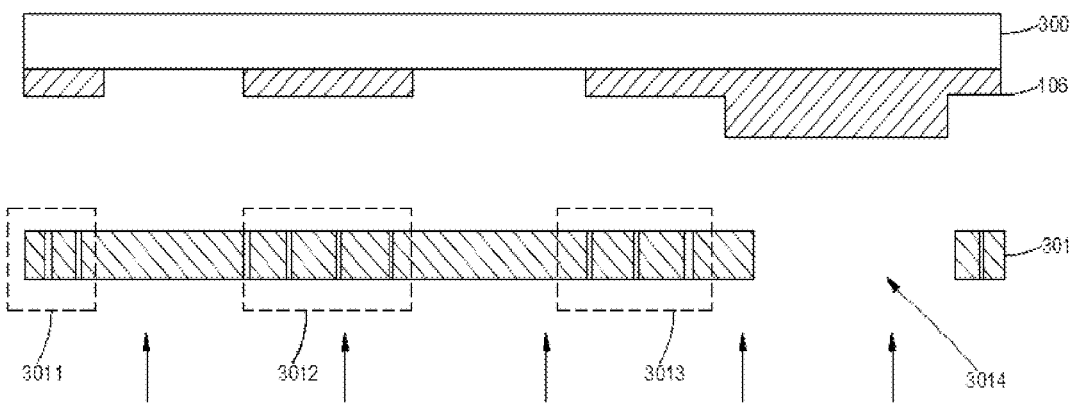
FIG. 3 is a schematic diagram of a film structure corresponding to a fabrication process provided by an embodiment of the present application.

As shown in FIG. 3, FIG. 3 is a schematic diagram of the film structure corresponding to the fabrication process provided by the embodiment of the application. During fabrication, a base substrate is first provided. In some embodiments of the present application, the base substrate is described by taking a glass substrate as an example.

At the same time, a first mask 301 is provided, and the first mask 301 is a half-open mask. Specifically, the first mask 301 is provided with openings of different degrees for evaporation deposition in different regions, such as a first opening region 3011, a second opening region 3012, and a third opening region 3013. The first opening region 3011, the second opening region 3012, and the third opening region 3013 are correspondingly disposed in the pixel spacer region of the display panel respectively. In this way, when the film layer is formed by evaporation deposition on the base substrate 300 through the first mask 301, evaporation-deposited film layers of different thicknesses can be formed in the corresponding opening areas, and then form a difference with evaporation-deposited film layers in the light-emitting sub-pixel region 3014.

In the light-emitting sub-pixel region 3014, the mask 301 is disposed to be completely open, that is, the evaporation-deposited material can be completely evaporation-deposited on the corresponding base substrate in the region, thereby forming a complete single-layer color resist. For example, a third color resist, namely, the blue color resist 106 is formed.

In this way, during the evaporation deposition of the light filter layer, the required light filter layer structure can be formed in different regions on the surface of the base substrate 300, and then prepare for the light shielding laminated structure to be formed later.

Figure 4:
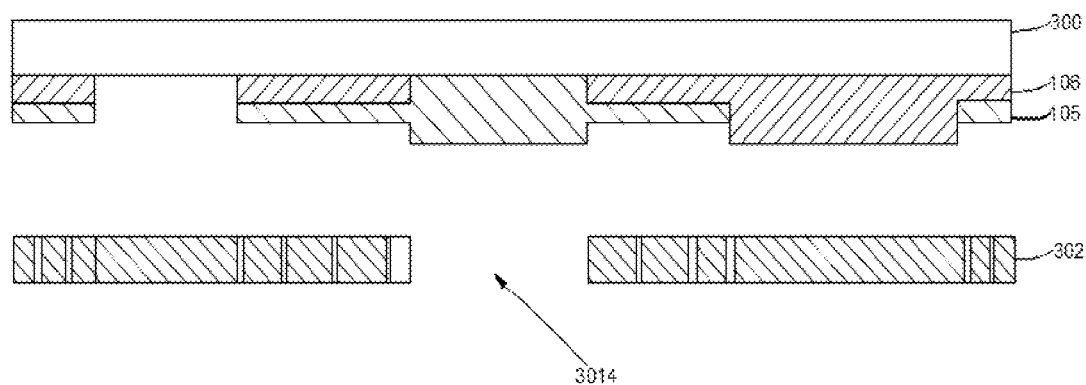
FIG. 4 is a schematic diagram of another process of the display panel provided by an embodiment of the present application.

As shown in FIG. 4, FIG. 4 is a schematic diagram of another process of the display panel provided by an embodiment of the application. A second mask 302 is provided. The second mask 302 and the first mask 301 are provided with different half openings. Specifically, the green color resist 105 is fabricated through the second mask 302. At this time, the completely open area of the second mask 302 is the corresponding light-emitting sub-pixel region 3014, that is, the corresponding green sub-pixel region. In this way, during evaporation deposition, materials for evaporation deposition can form a complete green color resist 105 structure in the region corresponding to the light-emitting sub-pixel region 3014.

At the same time, in the embodiments of the present application, different types of half-openings are also provided in different pixel spacing regions of the display panel, so as to ensure that when evaporation deposition is performed, light filter layers of different thicknesses can be formed in the corresponding pixel spacing regions to prepare for the subsequent layered structure.

After the evaporation deposition is completed, a complete film structure of the green color resist 105 as shown in FIG. 4 is formed.

Figure 5:
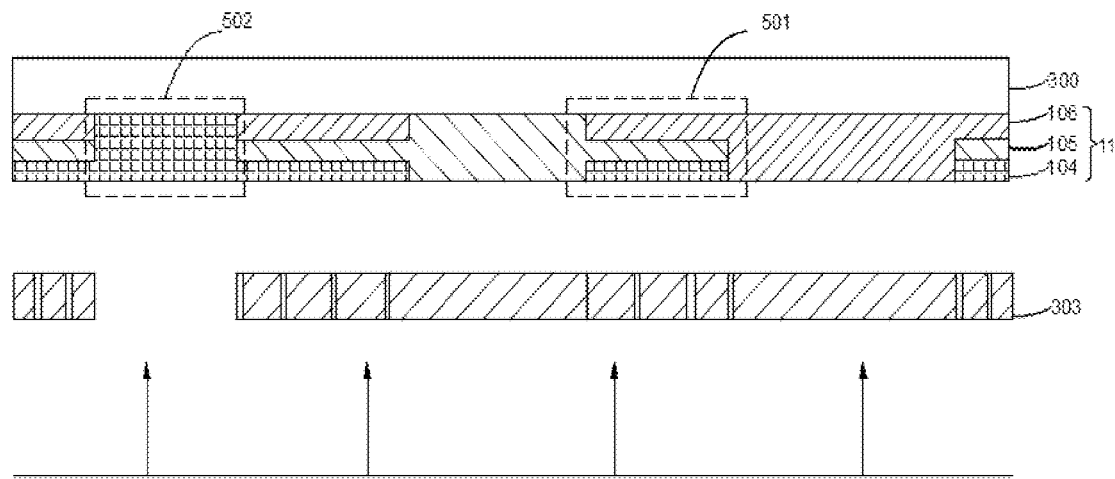
FIG. 5 is a schematic diagram of another fabrication process provided by an embodiment of the present application.

As shown in FIG. 5, FIG. 5 is a schematic diagram of another manufacturing process provided by an embodiment of the application. At this time, a third mask 303 is provided. Compared with the first mask 301 and the second mask 302, the third mask 303 is a mask for evaporation deposition of the red color resist 104. The third mask 303 is provided with different half-opening degrees in different regions. Specifically, it can be disposed according to the thickness of the corresponding film layer obtain a light filter layer of the required thickness, which will not be repeated here.

After the evaporation deposition is completed, the film structure shown in FIG. 5 is formed. Specifically, the formed light filter layer 11 comprises a single-layer light filter layer 502 and a laminated light shielding layer 501. The single-layer light filter layer 502 is correspondingly arranged in the light-emitting sub-pixel regions of different colors, and the laminated light-shielding layer 501 is arranged in the pixel spacer region. The purpose of color display can be realized when light emitted by the light-emitting sub-pixels can effectively pass through the corresponding single-layer light filter layer 502.

Meanwhile, when light reaches the laminated light-shielding layer 501, since the laminated light-shielding layer 501 is a composite film layer of the red color resists, the blue color resists, and the green color resists, the laminated light-shielding layer can effectively block the emitted light, thereby effectively suppressing the reflection problem of other film layers in the display panel and effectively improving display effects of the display panel.

Further, when fabricating the above-mentioned light filter layers of different colors, it is not limited to fabrication by the evaporation deposition process, and can also be by processes such as inkjet printing or gravure printing. The formed light filter layer comprises a single-layer light filter layer and a laminated light-shielding layer structure layer, thereby effectively improving display effect of the display panel.

Preferably, the light filter layer in this embodiment of the present application is directly evaporation deposited and formed on the base substrate 300. After the evaporation deposition is completed, the light filter layer 11 and the base substrate 300 are directly bonded to other film layers of the OLED device, and the black matrix layer and other light-shielding structures are omitted. In addition, the light filter layers with different structures are fabricated through the same mask when forming the above-mentioned light filter layers. Therefore, the fabrication process is simple. Finally, a completed OLED display panel is formed, thereby effectively simplifying a film structure of the display panel and improving display effect of the display panel.

Figure 6:
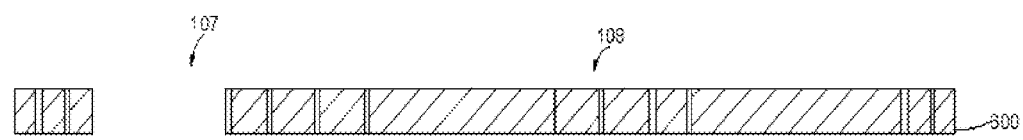
FIGS. 6-8 are schematic diagrams of another process flow for manufacturing the display panel provided by another embodiment of the present application.
Figure 6:
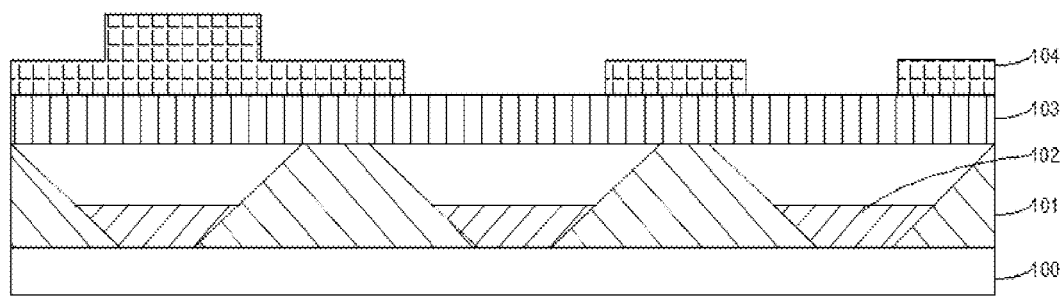
Figure 7:
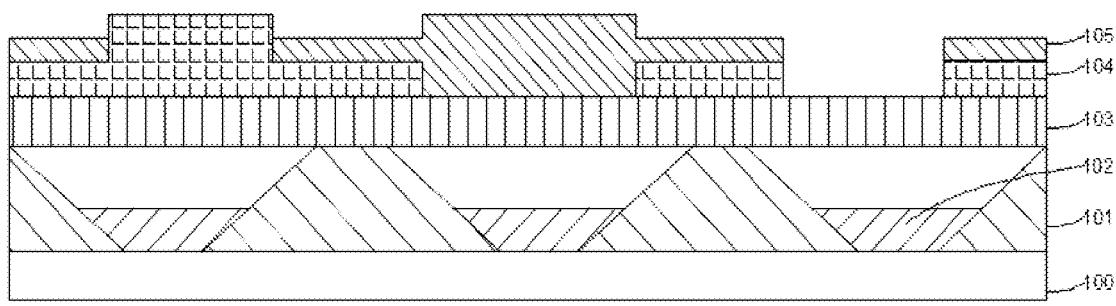
Figure 8:
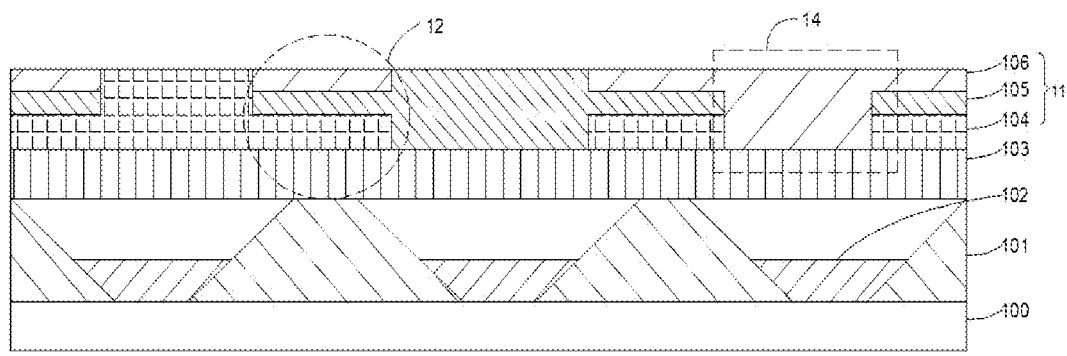

Further, as shown in FIGS. 6-8, FIGS. 6-8 are schematic diagrams of another process flow of a method for manufacturing a display panel provided by embodiments of the application. In this embodiment, after the array substrate and the encapsulation layer 103 are formed, light filter layers of different colors are directly formed on the encapsulation layer 103.

When forming the red color resist 104, another mask 600 is first provided, and the mask 600 is a mask corresponding to the red color resist 104. The mask 600 is a half-open mask, and the mask 600 is provided with different degrees of openings in different regions. Different structures of light filter layers are formed on the encapsulation layer 103 through the different openings. As shown in the figure, in the light-emitting sub-pixel region 107, the mask 600 is completely open, and in the pixel spacer region 108, the mask 600 is half-open.

Refer to FIG. 7 for details. After the fabrication of the red color resist 104 is completed, another mask is selected, such as a mask corresponding to the green color resist 105, and a desired structure of the green color resist 105 is formed through evaporation deposition. After the green color resist 105 is fabricated, another type of mask is selected, such as a mask corresponding to the blue color resist 106, and the blue color resist 106 is formed through the mask by evaporation deposition.

Therefore, after the red color resist 104, the green color resist 105, and the blue color resist 106 are fabricated, a complete light filter layer 11 structure is finally formed. The formed light filter layer 11 comprises a laminated structure 12 and a single-layer light filter layer structure 14. Among them, the laminated structure 12 can effectively block the light, thereby avoiding the color shift of the light reflected inside the OLED device, so as to improve the display quality and display effect of the display panel.

Further, an embodiment of the present application also provides a display device, in which the display panel in the embodiment of the present application or the light filter layer provided in the embodiment of the present application is provided in the display device. Since the structure of the film layer provided by the embodiment of the present application is provided, the film layer structure is effectively simplified, and display effect of the display panel are improved.

A display panel and a method for manufacturing same are provided in the embodiments of the present application are described in detail above. Specific examples are used in this article to illustrate the principles and implementation of the present application. Its core idea, at the same time, for those skilled in the art, according to the idea of this application, there will be changes in the specific implementation and scope of application. In summary, the content of this specification should not be construed as a limitation to the present application.

What is claimed is:

1. A display panel, comprising:
   a light emitting device layer; and
   a light filter layer, wherein the light filter layer comprises a plurality of color resists arranged on a light-emitting side of the light emitting device layer and a light shielding layer located between adjacent color resists, and the color resists comprise a red color resist, a green color resist, and a blue color resist;
   wherein each of the plurality of color resists has an extension portion, and the extension portions of the plurality of color resists are stacked on a pixel spacer region of the display panel to form the light shielding layer, and black light-absorbing particles are arranged in the extension portion, and
   wherein the display panel further comprises a base substrate and a pixel definition layer, the pixel definition layer forms a light-emitting sub-pixel region and the pixel spacer region alternatively disposed on the substrate, the extension portions of the plurality of color resists comprise a first color control layer, a second color control layer, and a third color control layer sequentially stacked in the pixel spacer region to form a laminated structure, and respective one of the red color resist, the green color resist, and the blue color resist is disposed in the light-emitting sub-pixel region.

2. The display panel according to claim 1, wherein the first color control layer, the second color control layer, and the third color control layer are red color resists, green color resists, and blue color resists arranged in any order.

3. The display panel of claim 2, wherein thicknesses of the first color control layer, the second color control layer, and the third color control layer are less than thicknesses of the plurality of color resists.

4. The display panel of claim 1, wherein the first color control layer, the second color control layer, and the third color control layer have a same thickness.

5. The display panel of claim 1, wherein a thickness of the light shielding layer is same as thicknesses of the plurality of color resists.

6. The display panel of claim 1, wherein the display panel further comprises an encapsulation layer disposed between the light emitting device layer and the light filter layer.

7. A display panel, comprising:
   a light emitting device layer; and
   a light filter layer, wherein the light filter layer comprises a plurality of color resists arranged on a light-emitting side of the light emitting device layer and a light shielding layer located between adjacent color resists, and the color resists comprise a red color resist, a green color resist, and a blue color resist;
   wherein each of the plurality of color resists has an extension portion, and the extension portions of the plurality of color resists are stacked on a pixel spacer region of the display panel to form the light shielding layer, and
   wherein the display panel further comprises a base substrate and a pixel definition layer, the pixel definition layer forms a light-emitting sub-pixel region and the pixel spacer region alternatively disposed on the substrate, the extension portions of the plurality of color resists comprise a first color control layer, a second color control layer, and a third color control layer sequentially stacked in the pixel spacer region to form a laminated structure, and respective one of the red color resist, the green color resist, and the blue color resist is disposed in the light-emitting sub-pixel region.

8. The display panel of claim 7, wherein the first color control layer, the second color control layer, and the third color control layer are red color resists, green color resists, and blue color resists arranged in any order.

9. The display panel of claim 8, wherein thicknesses of the first color control layer, the second color control layer, and the third color control layer are less than thicknesses of the plurality of color resists.

10. The display panel of claim 8, wherein the first color control layer, the second color control layer, and the third color control layer have a same thickness.

11. The display panel of claim 7, wherein the display panel further comprises an encapsulation layer disposed between the light emitting device layer and the light filter layer.

12. The display panel of claim 7, wherein the first color control layer, the second color control layer, and the third color control layer have a same length.

13. The display panel of claim 6, wherein the encapsulation layer comprises a first inorganic layer, a first organic layer, and a second inorganic layer sequentially stacked.

14. The display panel of claim 11, wherein the encapsulation layer comprises a first inorganic layer, a first organic layer, and a second inorganic layer sequentially stacked.

\* \* \* \* \*